(12) United States Patent
O'Brien

(10) Patent No.: US 9,034,764 B2
(45) Date of Patent: May 19, 2015

(54) METHOD OF FORMING WIDE TRENCHES USING A SACRIFICIAL SILICON SLAB

(71) Applicant: Robert Bosch GmbH, Stuttgart (DE)

(72) Inventor: Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 243 days.

(21) Appl. No.: 13/673,033

(22) Filed: Nov. 9, 2012

(65) Prior Publication Data

US 2013/0115775 A1    May 9, 2013

Related U.S. Application Data

(60) Provisional application No. 61/557,798, filed on Nov. 9, 2011, provisional application No. 61/585,803, filed on Jan. 12, 2012.

(51) Int. Cl.
*H01L 21/311* (2006.01)
*B81C 1/00* (2006.01)

(52) U.S. Cl.
CPC ...... *H01L 21/31111* (2013.01); *B81C 1/00063* (2013.01); *B81C 1/00333* (2013.01); *B81B 2203/033* (2013.01); *B81C 2203/0136* (2013.01)

(58) Field of Classification Search
USPC ........................................................ 438/702
See application file for complete search history.

(56) References Cited

U.S. PATENT DOCUMENTS

| | | | | |
|---|---|---|---|---|
| 6,566,219 B2 * | 5/2003 | Kunkel et al. | | 438/386 |
| 7,142,921 B2 | 11/2006 | Mattes et al. | | |
| 7,412,921 B2 * | 8/2008 | Hu et al. | | 99/295 |
| 2004/0048410 A1 * | 3/2004 | O'Brien et al. | | 438/52 |
| 2005/0098840 A1 * | 5/2005 | Fuertsch et al. | | 257/414 |
| 2006/0063392 A1 * | 3/2006 | Ventzek et al. | | 438/778 |
| 2007/0026636 A1 | 2/2007 | Gogoi | | |
| 2008/0290442 A1 * | 11/2008 | Hshieh et al. | | 257/487 |
| 2010/0193867 A1 * | 8/2010 | Yan et al. | | 257/355 |
| 2012/0043626 A1 * | 2/2012 | Lin et al. | | 257/415 |

OTHER PUBLICATIONS

Graham et al., "Wafer Scale Encapsulation of Large Lateral Deflection MEMS Structure," Research Paper, 2009, pp. 745-748, IEEE, USA (4 pages).

Zhang et al., "Residual stress and fracture in thick tetraethylorthosilicate (TEOS) and silane-based PECVD oxide films," Sensors and Actuators A, 2001, pp. 373-380, vol. 91, Elsevier, USA (8 pages).

(Continued)

*Primary Examiner* — Charles Garber
*Assistant Examiner* — Stanetta Isaac
(74) *Attorney, Agent, or Firm* — Maginot Moore & Beck LLP

(57) ABSTRACT

A method of forming an encapsulated wide trench includes providing a silicon on oxide insulator (SOI) wafer, defining a first side of a first sacrificial silicon slab by etching a first trench in a silicon layer of the SOI wafer, defining a second side of the first sacrificial silicon slab by etching a second trench in the silicon layer, forming a first sacrificial oxide portion in the first trench, forming a second sacrificial oxide portion in the second trench, forming a polysilicon layer above the first sacrificial oxide portion and the second sacrificial oxide portion, and etching the first sacrificial oxide portion and the second sacrificial oxide portion.

15 Claims, 6 Drawing Sheets

(56) References Cited

OTHER PUBLICATIONS

International Search Report and Written Opinion in corresponding PCT application (i.e., PCT/US2012/064386), mailed Mar. 26, 2013 (9 pages).

Ayanoor-Vitikkate et al., "Wafter Scale Encapsulation of Wide Gaps using oxidation of Sacrificial Beams," 31st International Conference on Electronics Manufacturing and Technology, IEEE, Piscataway, NJ, USA, Nov. 8, 2007, pp. 300-306, XP031233469 (8 pages).

\* cited by examiner

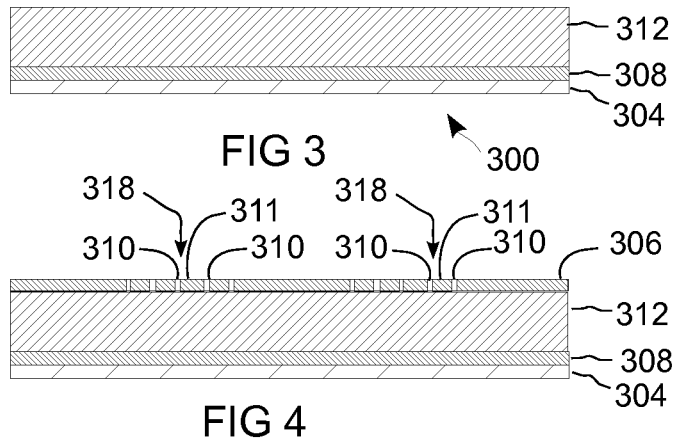
FIG 3
FIG 4
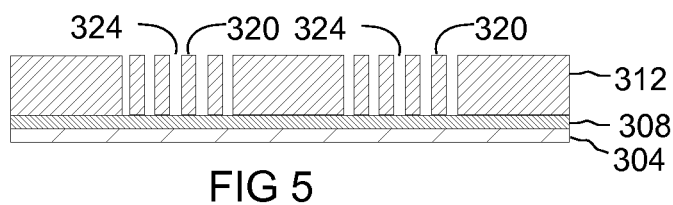
FIG 5
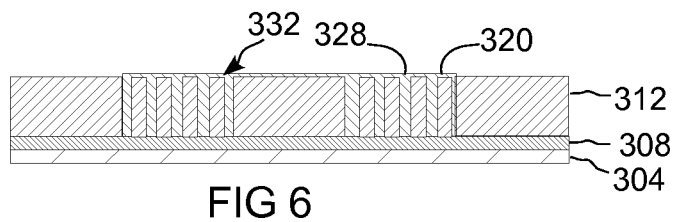
FIG 6
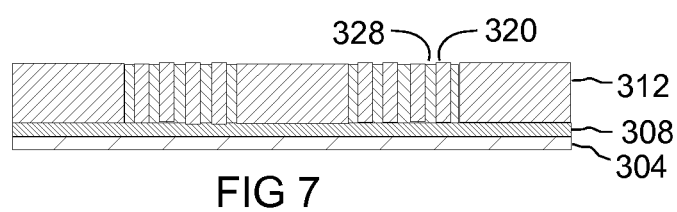
FIG 7
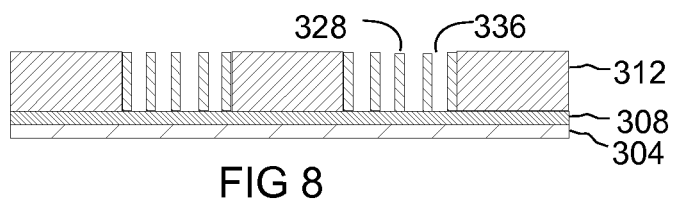
FIG 8

US 9,034,764 B2

METHOD OF FORMING WIDE TRENCHES USING A SACRIFICIAL SILICON SLAB

This application claims the benefit of U.S. Provisional Application No. 61/557,798, filed Nov. 9, 2011, and U.S. Provisional Application No. 61/585,803 filed Jan. 12, 2012, the entire contents of which are both herein incorporated by reference.

TECHNICAL FIELD

This disclosure pertains to the fields of microelectromechanical systems (MEMS) and wafer level encapsulation of silicon structures.

BACKGROUND

Microelectromechanical systems (MEMS) are commonly formed by etching components into a thin wafer of silicon. While MEMS devices are much smaller than macroscopic machines, many MEMS devices need moving parts just like their macroscopic counterparts, requiring that some components in the MEMS device be surrounded by free space allowing them to move. Free space allowing a MEMS component to move may be formed by etching trenches into the silicon layer that surrounds components in a MEMS device. Additionally, after some MEMS devices are etched from a silicon wafer, a cap layer of polysilicon material is deposited over top the MEMS to encapsulate the device. This cap layer seals the inner moving parts into an internal cavity, and may route electrical connectors to and from the MEMS devices as well.

Currently, MEMS structures with a high width to depth aspect ratio greater in thickness than a few microns are limited to displacements on the order of a few microns or less when polysilicon deposition layers are used to encapsulate the device perimeter to form a hermetic outer shell. The limitation exists because a layer of oxide, often $SiO_2$, is used as a spacer to separate the polysilicon cap from the underlying components in the MEMS. The oxide layer must span any trenches formed in the silicon or device layer in order to form an even surface on which the polysilicon cap may be deposited. As the width of the trenches increases, the amount of oxide that must be deposited must also increase in order to provide the desired flatness. Thicker oxide layers increase the bulk of a device. Additionally, as oxide layer thickness increase, the stresses imparted onto the underlying wafer by the oxide layer increase. Thus, if a particular oxide layer is too thick, the underlying wafer may crack under the strain.

Because of the foregoing limitations, a typical prior art MEMS hermetic encapsulation process allows for internal trenches of up to about 0.2 μm-1.5 μm in size. Because many MEMS structures must be able to move in order to operate, the small internal trench size limits the range of motion that can be attained using current trench forming techniques. For example, the prior art trench formation techniques allow for the formation of MEMS devices such as capacitive resonators and oscillators that only need to travel within the 0.52 μm-0.58 μm range of existing trenches. Different types of MEMS such as accelerometers or gyroscopes require much larger travel distances and cannot be fabricated in the same generic silicon technology. Typical MEMS vibratory gyroscopes require a movement range on the order of 5 μm-10 μm in order to mechanically amplify angular rate sense mode Coriolis response displacement as a function of drive mode velocity, where $\vec{F}_{Coriolis} = 2m\vec{v} \times \vec{\Omega}$.

This need for increased range of motion requires the trench width to increase to allow for a range of motion of approximately 5 μm-10 μm in order to provide the desired amount of travel. Using prior art techniques, these wider trenches require an upper oxide layer approximately 10 μm-20 μm in thickness, requiring a large amount of oxide. Moreover, the thick layer generates stress that would likely fracture the underlying silicon wafer. Thus, prior art trench forming methods do not allow for many useful MEMS components like accelerometers and gyroscopes to be manufactured in the manner described above.

What is needed is a method of forming wide area trenches in MEMS devices encapsulated with conformal deposition films. What is further needed is a method for avoiding film stresses in silicon wafers used for fabrication of large displacement MEMS devices.

SUMMARY

In accordance with one embodiment, a method of forming an encapsulated wide trench includes providing a silicon on oxide insulator (SOI) wafer, defining a first side of a first sacrificial silicon slab by etching a first trench in a silicon layer of the SOI wafer, defining a second side of the first sacrificial silicon slab by etching a second trench in the silicon layer, forming a first sacrificial oxide portion in the first trench, forming a second sacrificial oxide portion in the second trench, forming a polysilicon layer above the first sacrificial oxide portion and the second sacrificial oxide portion, and etching the first sacrificial oxide portion and the second sacrificial oxide portion.

In accordance with another embodiment, a method of forming a trench in a silicon on insulator (SOI) wafer includes etching a first trench in a device layer, etching a second trench in the device layer, thereby defining a first sacrificial slab, forming a first sacrificial oxide portion in the first trench, forming a second sacrificial oxide portion in the second trench, sacrificing the first sacrificial slab, etching the first sacrificial oxide portion, and etching the second sacrificial oxide portion.

BRIEF DESCRIPTION OF DRAWINGS

FIG. 3 depicts a partial cross-sectional view of a wafer with a silicon layer and an oxide substrate;

FIG. 4 depicts a partial cross-sectional view of the silicon wafer of FIG. 3 with the addition of a photolithographic mask on the silicon layer.

FIG. 5 depicts a partial cross-sectional view of the silicon wafer of FIG. 4 including a series of narrow trenches and sacrificial silicon slabs.

FIG. 6 depicts a partial cross-sectional view of the silicon wafer of FIG. 5 with an oxide material filling the narrow trenches.

FIG. 7 depicts a partial cross-sectional view of the silicon wafer of FIG. 6 where the upper surface of each sacrificial silicon slab is exposed.

FIG. 8 depicts a partial cross-sectional view of the silicon wafer of FIG. 7 where open cavities separate oxide finger structures.

DETAILED DESCRIPTION

Figure 1:
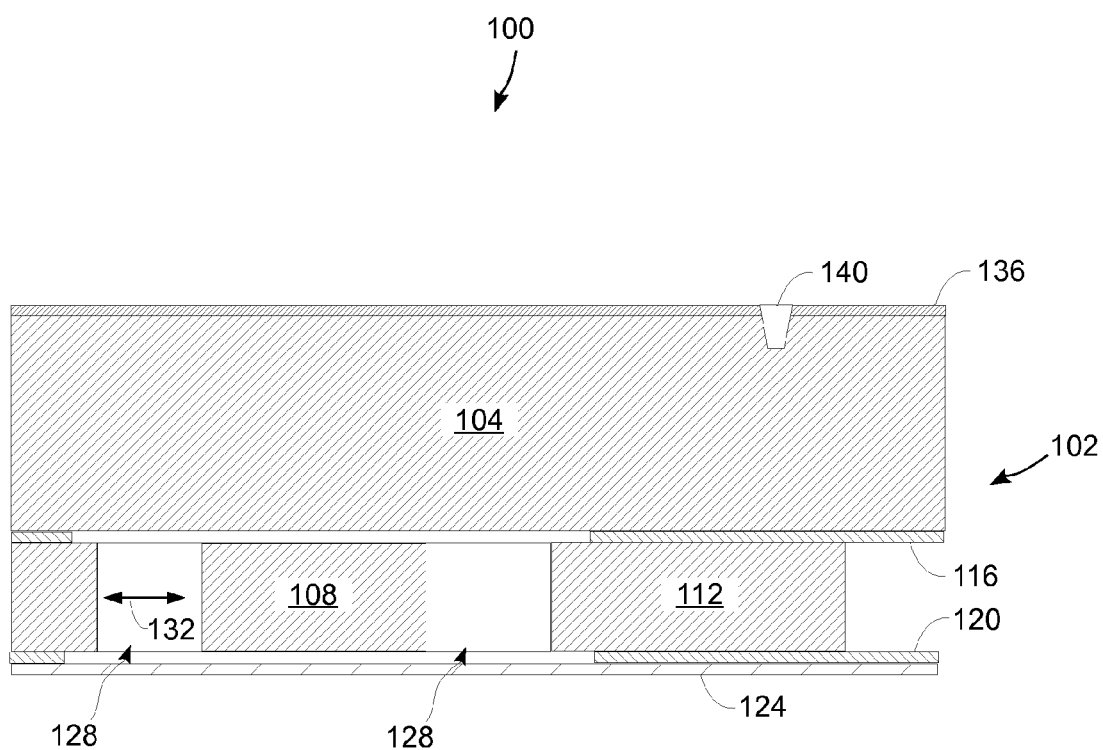
FIG. 1 depicts a partial cross-sectional view of a resonator fabricated with a wide trench.

FIG. 1 depicts a partial cross-sectional view of a resonator 100 formed in a silicon wafer using wide trenches. The depicted layers 102 include a cap layer 104, typically composed of polysilicon. The cap layer 104 is positioned above an oxide layer 116, which is typically composed of an oxide such as $SiO_2$. The cap layer 104 of FIG. 1 forms a hermetic seal around the MEMS resonator. The oxide layer 116 is formed above a fixed silicon component 112. The fixed silicon component 112 is a stationary component of the resonator MEMS, and this component also has an oxide layer 120 located beneath its lower surface. The lower oxide layer 120 insulates the fixed silicon component 112 from the silicon substrate 124.

The resonator arm 108 is formed in the same layer as fixed silicon component 112 and from the same silicon material as the fixed silicon component 112. Unlike the fixed silicon component 112, the resonator arm 108 does not have an oxide layer on either its upper or lower surface. This allows the resonator arm 108 to resonate as indicated by arrows 132.

The resonator arm 108 has a range of motion limited by the width of the trenches 128 that are formed on the lateral sides of the resonator arm 108. In the resonator of FIG. 1, these trenches 128 are formed having a width of between 5 µm and 10 µm, depending upon the intended range of motion for the resonator arm 108.

FIG. 1 also depicts an optional insulator layer 136 and electrode 140 affixed to the upper surface of the cap layer 104. The insulator layer 136 separates electrical traces (not shown) from the polysilicon cap 104, and the electrode 140 may be used to transmit electric power to a MEMS, or to receive electrical signals generated by a MEMS.

Figure 2:
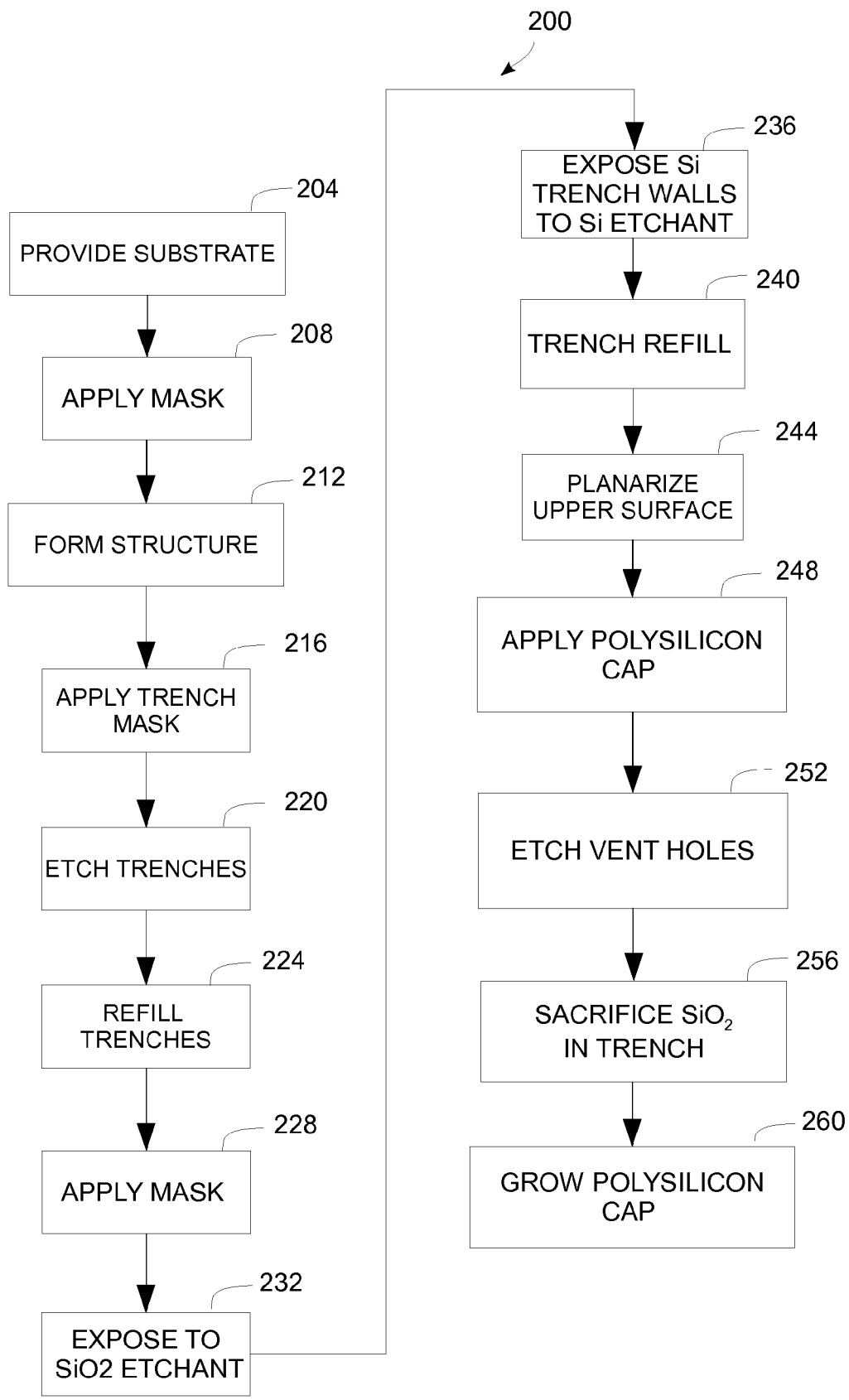
FIG. 2 depicts a process of forming wide trenches in a silicon wafer using sacrificial silicon slabs.

FIG. 2 depicts a method 200 that may be used to form the wide trenches 128 depicted in FIG. 1. A silicon substrate (handle layer) supporting an oxide insulator layer (buried oxide layer) and a silicon working or device layer disposed above the buried oxide layer (an SOI wafer) is provided (block 204). A photolithographic mask is then applied on the upper surface of the device layer (block 208), and the outline of a MEMS device is formed by etching trenches into the device layer according to the pattern drawn in the mask (block 212). The trenches may be etched using a deep reactive ion etch (DRIE) process.

A second mask that has a series of strips is then formed on the device layer (block 216). The narrow strip pattern is used in forming regions of oxide in the MEMS that will be removed in order to allow the final device to operate. The strip pattern in one embodiment overlies each region with equal strips of 0.8 µm masking material separated by gaps of 0.4 µm. Once the mask is applied, etching forms trenches in the device layer, with each trench extending entirely through the device layer to expose the buried oxide layer (block 220). In the embodiment of FIG. 2, the etching process removes both the silicon directly under the gaps in the mask, and a portion of the silicon on either side of each gap. The etching process thus forms narrow trenches approximately 0.55 µm to 0.6 µm wide which are separated by slabs of silicon of about 0.55 µm to 0.6 µm in width. These silicon slabs are referred to herein as sacrificial silicon slabs because these slabs will be removed (sacrificed) to form the wide trenches in the final MEMS device. The process used to etch narrow trenches in this embodiment may be Deep Reactive Ion Etching (DRIE), described by G. O'Brien, et al. in "*Deep Reactive Ion Etched Submicron Beam/Trench Characterization*," ASME International Mechanical Eng. Congress and Expo, Vol 3, pp. 97-101, New York City, New York, 2001. Other methods of etching trenches with a high depth to width aspect ratio would also be effective for use in the process of FIG. 2.

Continuing to refer to FIG. 2, a trench filling process deposits an oxide, typically $SiO_2$, into the narrow trenches, refilling them completely (block 224). The trench filling process also results in some of the oxide material being deposited on the upper surfaces of the sacrificial silicon slabs. In order to expose the upper surfaces of the sacrificial silicon slabs, a UV photoresist mask is applied over the void region (block 228), and the void region is exposed to an etchant, removing the $SiO_2$ covering the sacrificial silicon slabs. The $SiO_2$ etchant may be a dry plasma based etchant.

The exposed sacrificial silicon slabs are sacrificed by exposure to a silicon chemical etchant, such as sulfur hexafluoride ($SF_6$) (block 236). This etchant vaporizes the silicon slabs, while leaving the $SiO_2$ fingers that filled the narrow trenches intact. The silicon etching process continues until the sacrificial silicon slabs have been completely removed, leaving empty cavities approximately 0.6 µm wide corresponding to the space the silicon slabs originally occupied. The cavities are substantially filled by a second trench refill process that fills in $SiO_2$, forming a second series of interlocking $SiO_2$ fingers (block 240).

A planarization process of the upper surfaces of the thickened $SiO_2$ fingers deposits an even layer of oxide, typically $SiO_2$, over the upper surface of the void area to form an even surface for receiving the polysilicon cap layer (block 244). The planarized oxide layer may be added via a brief, low pressure chemical vapor deposition process (LPCVD), or by applying a thin sheet of tetraethyl orthosilicate (TEOS) to the upper surface and then converting the TEOS sheet to $SiO_2$ using known methods. In the process of FIG. 2, the planarized oxide layer is preferably 1.2 µm thick.

A polysilicon cap is applied to the upper surface of the planarized oxide layer (block 248). This polysilicon layer may be formed on the planarized oxide layer using any desired process including vapor deposition techniques. The polysilicon cap in one embodiment is initially epitaxially grown to an intermediate thickness, in order to allow etching of a series of vent holes through the cap (block 252). These vent holes are selectively positioned to be above the portions of oxide to be sacrificed. For the process of FIG. 2, this includes the entire void area which now contains only $SiO_2$ material which possibly enclose some void areas. The sacrificial process takes place when a chemical etchant, such as vapor phase hydrofluoric acid (HF), passes through the vents, etching the $SiO_2$ located under the vents (block 256). The etching process forms the wide trenches 128 depicted in FIG. 1. Thus, the $SiO_2$ fingers and the upper $SiO_2$ surface form a sacrificial layer occupying the space in which the final wide trench is formed.

The polysilicon cap with vent holes etched in its surface is thickened by growing the polysilicon cap layer (block 260). One method to thicken the cap is via a chemical vapor deposition process. In addition to thickening the polysilicon cap, the thickening process seals the vent holes, and the MEMS device is now hermetically sealed under the polysilicon cap.

FIGS. 3-14 depict formation of a device using the process of FIG. 2. FIG. 3 depicts a partial cross-sectional view of a silicon wafer 300. The wafer 300 includes a substrate or handle layer of silicon 304 beneath a buried oxide layer 308. The buried oxide layer 308 is typically $SiO_2$. A silicon device layer 312 is formed above the upper surface of the buried oxide layer 308. The arrangement of the silicon working layer 312 on the oxide insulator forms a silicon on insulator (SOI) structure.

Next, a photolithographic mask 306 is formed on the upper surface of the device layer 312 as depicted in FIG. 4. The mask 306 has a plurality of gaps 310, each approximately 0.4 μm in width, which are separated from each other by mask resist strips 311, each approximately 0.8 μm wide. The gaps 310 and resist strips 311 are selectively placed over regions 318 of the device layer 312 that are to be sacrificed.

Narrow trenches 324 are etched into the device layer 312, thereby defining sacrificial silicon slabs 320 which remain between the trenches 324 as depicted in FIG. 5. As discussed above with reference to FIG. 2, one embodiment uses a DRIE etching process to form the narrow trenches, with two adjacent trenches defining a sacrificial silicon slab therebetween.

The narrow trenches 324 of FIG. 5 extend through the entire device layer 312, exposing portions of the buried oxide layer 308. The etching process results in alternating narrow trenches 324 and sacrificial silicon slabs 320 at equal widths of approximately 0.6 μm.

Referring now to FIG. 6, an oxide material 328 is used to fill the narrow trenches 324. The oxide material 328, typically $SiO_2$, extends from the upper surface of the device layer 312 to the buried oxide layer 308. A portion 332 of the deposited oxide extends above the upper surface of the device layer 312 and covers the upper surfaces of the sacrificial silicon slabs 320.

A UV photoresist mask (not shown) is then applied to the wafer 300 and an etching process is used to remove the portion 332 of the oxide layer covering the sacrificial silicon slabs 320. Accordingly, the upper surface of each sacrificial silicon slab 320 is exposed as depicted in FIG. 7.

Next, the sacrificial silicon slabs 320 are removed from the silicon wafer 300 via chemical etching, typically using sulfur hexafluoride ($SF_6$) as an etchant, resulting in the configuration of FIG. 8. In FIG. 8, cavities 336 separate the oxide material 328 finger structures. The cavities 336 occupy the same space originally held by the sacrificial silicon slabs 320.

Figure 9:
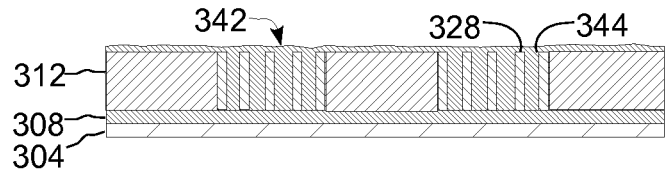
FIG. 9 depicts a partial cross-sectional view of the silicon wafer of FIG. 8 where the open cavities have been filled with additional oxide fingers.

A second trench refill process fills the cavities 336 with oxide, typically $SiO_2$, as depicted in FIG. 9. The oxide fingers 344 which fills the cavities 336 interlock with the existing oxide fingers 328. The oxide deposited during the refill process has an uneven upper surface 342.

Figure 10:
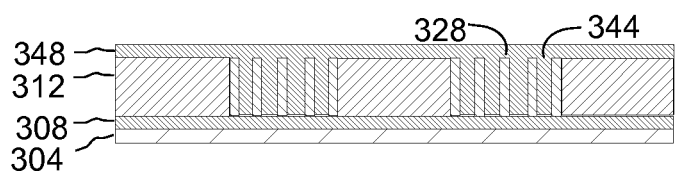
FIG. 10 depicts a partial cross-sectional view of the silicon wafer of FIG. 9 with an additional planarized oxide layer formed over the upper surface of the working silicon layer and the oxide fingers.

A planarized oxide layer 348 is then formed over the upper surface of the device layer 312 and over the upper surface 342 as depicted in FIG. 10. The planarized oxide layer 348 may be added via a brief, low pressure chemical vapor deposition process (LPCVD), or by applying a thin sheet of tetraethyl orthosilicate (TEOS) to the upper surface and then converting the TEOS sheet to $SiO_2$ using known methods. In the embodiment of FIG. 10, the planarized oxide layer 348 is approximately 1.2 μm thick.

Figure 11:
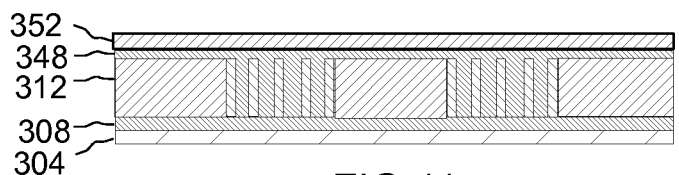
FIG. 11 depicts a partial cross-sectional view of the silicon wafer of FIG. 10 with an additional polysilicon cap layer.

A polysilicon cap layer 352 is then formed on the upper surface of the planarized oxide layer 348 as depicted in FIG. 11. The planarized oxide layer 348 provides a smooth surface on which to grow the polysilicon cap 352 via chemical vapor deposition or another known method to deposit a polysilicon layer onto an oxide surface.

Figure 12:
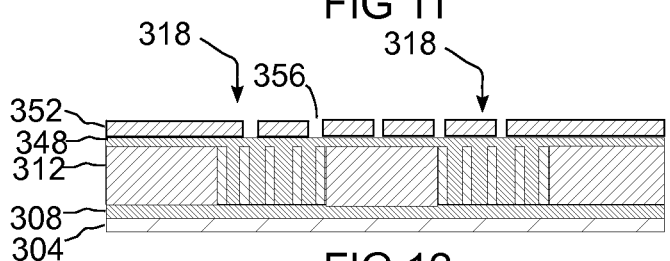
FIG. 12 depicts a partial cross-sectional view of the silicon wafer of FIG. 11 with a plurality of etch vent holes formed through the polysilicon cap layer.

A plurality of vent holes 356 are then etched through the polysilicon cap layer 352 as depicted in FIG. 12. The vent holes 356 are selectively etched above the oxide structures that fill the regions 318 of FIG. 4, and any other area where oxide should be sacrificed to form the final MEMS structure.

Figure 13:
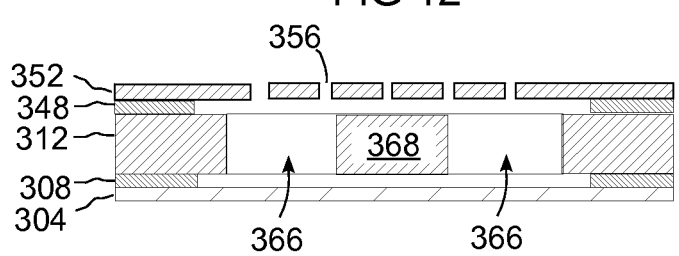
FIG. 13 depicts a partial cross-sectional view of the silicon wafer of FIG. 12 with wide trenches and a resonator arm.

An etchant is then introduced through the vent holes 356 resulting in etching of exposed oxide materials. The location of the vent holes 356 result in preferential etching of the oxide materials within the region 318, specifically, a portion of the oxide layer 348 immediately below the vent holes 356, the oxide fingers 328, the oxide fingers 344, and the portion of the buried oxide layer 308 directly below the vent holes 356. When etching is terminated, wide trenches 366 are formed about a resonator arm 368 as depicted in FIG. 13.

Figure 14:
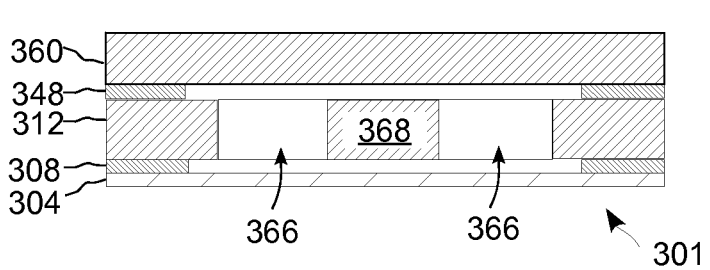
FIG. 14 depicts a partial cross-sectional view of the silicon wafer of FIG. 13 with a thicker polysilicon cap layer.

A thicker cap layer 360 is then formed above the polysilicon cap 352 as depicted in FIG. 14. This polysilicon cap layer 360 hermetically seals the MEMS resonator 301. The polysilicon cap 360 is grown using chemical vapor deposition techniques, and the thickening process also results in the closure of the vent holes 356. While FIG. 14 depicts a resonator MEMS, this depiction is merely an example of one type of encapsulated MEMS that may be formed using wide trenches. Many other types of structures and MEMS, including, but not limited to, gyroscopes and accelerometers may be formed using the wide trenches depicted in FIG. 14.

Figure 15:
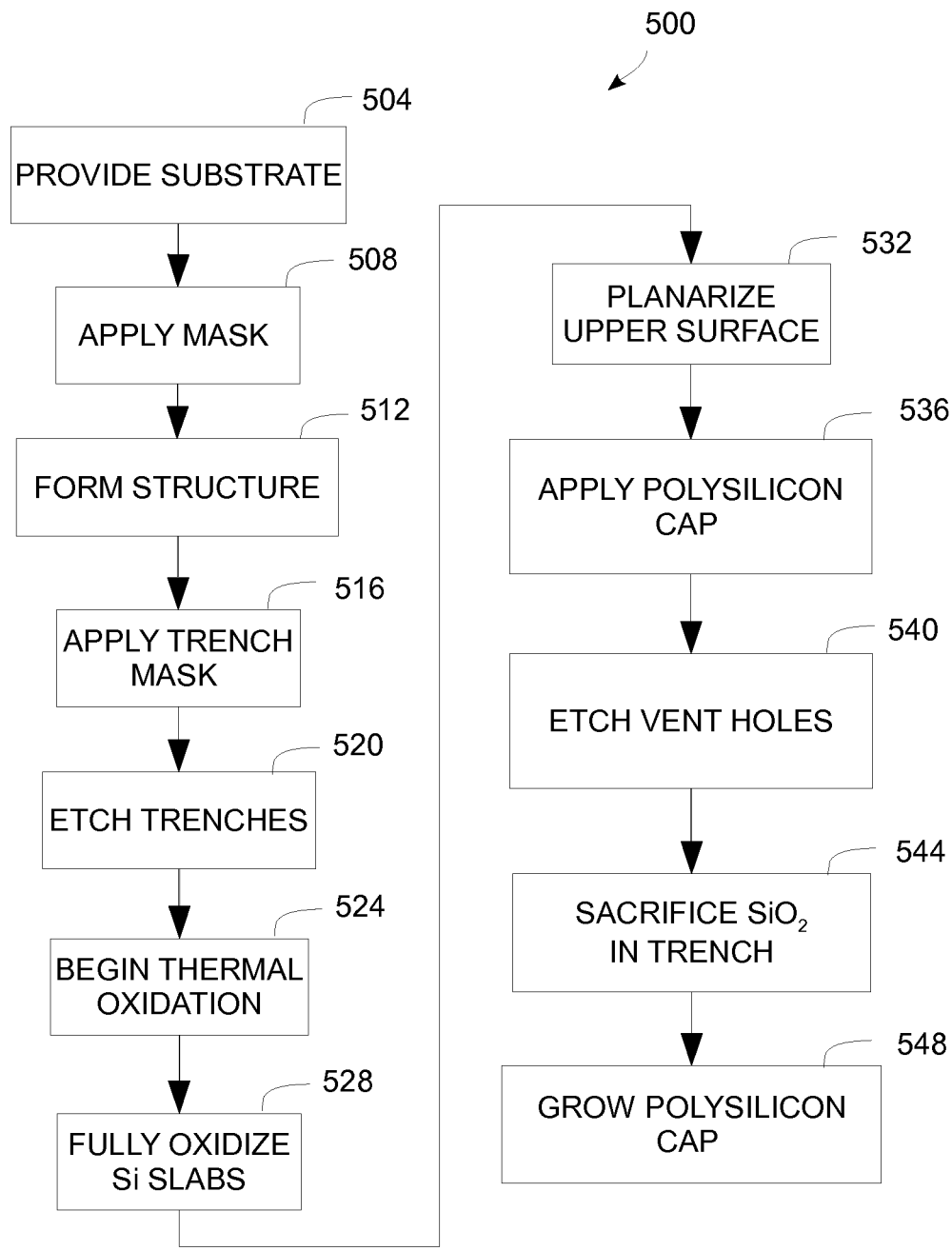
FIG. 15 depicts an alternative method of forming wide trenches in a silicon layer.

FIG. 15 depicts an alternative method 500 of forming wide trenches in a silicon layer. This process shares certain common steps with the process of FIG. 2. As in FIG. 2, a silicon wafer with an SOI structure is provided (block 504) and a photolithographic mask is applied (block 508). Trenches defining a MEMS structure are etched into the silicon wafer according to patterns drawn on the mask (block 512). Also as in FIG. 2, a second mask, patterned to form a series of narrow trenches in target regions of the wafer, is applied (block 516). In the embodiment of FIG. 15, the narrow trenches are then etched (block 520) using a DRIE process. In addition to the DRIE process, other methods of etching trenches with a high depth to width aspect ratio into a silicon layer would also be effective for use in the process of FIG. 2

The etched trenches formed by the process 500 of FIG. 15 may be identical in size and structure to those of FIG. 2. Thus, the width of each narrow trench in one embodiment is approximately 0.6 μm, and each narrow trench extends fully through the device layer to expose the buried oxide layer. Additionally, sacrificial silicon slabs approximately 0.6 μm wide are formed between the narrow trenches as in the process of FIG. 2. The process of FIG. 15 differs by using a thermal oxidation process, preferably at a temperature of 1000° C., to oxidize the sacrificial silicon slabs into $SiO_2$ slabs (block 524).

Figure 16:
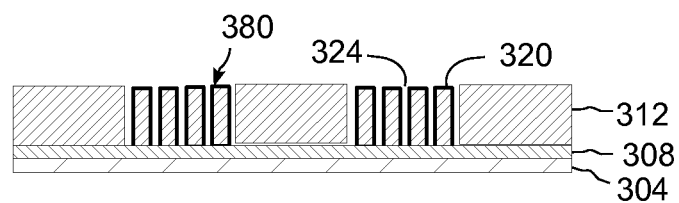
FIG. 16 depicts a partial cross-sectional view of the silicon wafer of FIG. 5 with an coating of oxide covering the surface of the sacrificial silicon slabs.

By way of example, a silicon wafer with a thin coating of oxide 380 surrounding the sacrificial silicon slabs 320 is depicted in FIG. 16. The oxide 380, typically SiO2, begins growing on the exposed surface of the sacrificial silicon slabs 320 during the thermal oxidation process of FIG. 15. The oxide coating 380 covers the exposed surfaces of the sacrificial silicon slabs 320, including the sides facing the narrow trenches 324, as well as the upper surface of each slab 320. This oxide coating continues to grow, oxidizing the silicon material in each sacrificial slab 320 into $SiO_2$.

Figure 17:
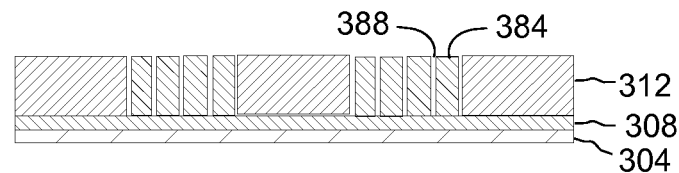
FIG. 17 depicts a partial cross-sectional view of the silicon wafer of FIG. 16 where the sacrificial silicon slabs have been oxidized to form sacrificial oxide slabs.

The thermal epitaxial oxidation process continues until all of the original sacrificial silicon slabs have been oxidized to $SiO_2$ (block 528). Once all of the silicon in the sacrificial slabs has been oxidized, the epitaxial growth process self-terminates since no remaining silicon is available to oxidize. As the Si in the slabs is converted to $SiO_2$, the slabs increase in size. FIG. 17 depicts a partial cross-sectional view of the silicon wafer of FIG. 16 where the sacrificial silicon slabs 320 have been oxidized to form sacrificial oxide slabs 384. The oxidization process also constricts the narrow trenches 388, leaving them approximately 0.2 μm wide in the depicted embodiment as described below.

In general, the conversion of Si to $SiO_2$ results in a growth by a factor of 0.54. Thus, if the process were conducted perfectly, a gap of 0.53 μm would require a sacrificial slab of 0.981 μm to perfectly fill the gap. In order to account for manufacturing variables, however, and because it is important to ensure that all of the sacrificial slab is consumed, it is desirable to leave a gap between slabs after full conversion. Thus, assuming an initial gap of 0.53 μm between adjacent slabs, a 0.55 μm slab will result in a gap after full conversion of the Si to $SiO_2$ of 0.233 μm (remembering that the slab grows into two adjacent gaps, but each gap has two adjacent slabs). A gap of 0.233 μm is easily covered by an oxide layer.

Figure 18:
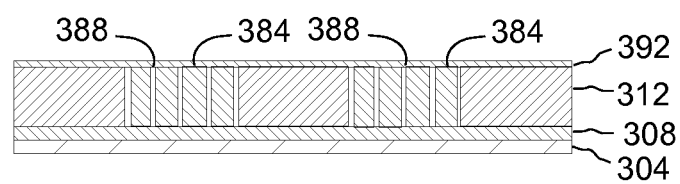
FIG. 18 depicts a partial cross-sectional view of the silicon wafer of FIG. 17 with an additional planarized oxide layer.

The process of FIG. 15 continues with planarization of the upper surface of the $SiO_2$ slabs using the same methods described in FIG. 2 (block 532). Assuming a gap of 0.233 μm, the planarized oxide layer thickness of this embodiment is about 0.6 μm. A planarized oxide layer 392 covering the upper surface of the sacrificial oxide slabs 384 and the silicon working layer 312 is depicted in FIG. 18. The planarized oxide layer 392 of FIG. 18 has a similar structure to the planarized oxide layer 348 of FIG. 10, but the planarized oxide layer 392 is preferably 0.6 μm thick. The structure of FIG. 18 is similar enough to that of FIG. 10 that the structures depicted in FIG. 11-FIG. 14 may be formed using the silicon wafer of FIG. 18.

The remaining process steps of FIG. 15 are identical to those of FIG. 2. The polysilicon cap layer is grown above the planarized oxide layer (block 536). Vent holes are etched into the cap over portions of the oxide layer to be sacrificed (block 540). An $SiO_2$ etchant such as vapor phase hydrofluoric acid (HF) passes through the vent holes and removes the sacrificial oxide portion (block 544). Finally, the polysilicon cap is grown to its final thickness, filling in the vent holes (block 548).

While the foregoing embodiments used a sacrificial slab in order to provide an oxide region that is subsequently etched to provide a wide trench, wide regions of oxide formed in the processes described above may be used without etching of the oxide region. For example, a $SiO_2$ slab may be formed in a substrate and used as a foundation upon which a MEMS device maybe formed. The $SiO_2$ foundation provides electrical isolation, parasitic capacitance reduction, and/or thermal isolation.

Additionally, bond pads typically represent undesirably large parasitic capacitance, especially when incorporated on a highly doped (low resistance) substrate such as SOI-MEMS and degenerately doped bulk silicon MEMS. Consequently, a thick oxide foundation would significantly reduce bond parasitic capacitance.

Through silicon vias (TSVs) are typically fabricated using DRIE to etch through most, if not all, of a silicon wafer. TSVs are typically highly doped to provide low electrical resistance vias from one side of a wafer to the opposite of the wafer. As a consequence of the low electrical resistance and small dielectric gaps, parasitic capacitances on the order of 10's of pico-Farads is not uncommon. This characteristic generally precludes TSVs from use as a capacitive MEMS sensor to ASIC interface since the parasitic capacitance would dwarf the 200-800 femto-Farad range sensor capacitances of a typical MEMS accelerometer or pressure sensor. Using a thick $SiO_2$ block as described in the processes above could significantly reduce undesirable parasitic capacitances.

While the invention has been illustrated and described in detail in the drawings and foregoing description, the same should be considered as illustrative and not restrictive in character. Only the preferred embodiments have been presented and all changes, modifications and further applications that come within the spirit of the invention are desired to be protected.

The invention claimed is:

1. A method of forming an encapsulated continuous wide trench comprising:
   providing a silicon on oxide insulator (SOI) wafer;
   defining a first side of a first sacrificial silicon slab by etching a first trench portion in a silicon layer of the SOI wafer;
   defining a second side of the first sacrificial silicon slab by etching a second trench portion in the silicon layer;
   filling the first trench with a first sacrificial oxide portion;
   filling the second trench with a second sacrificial oxide portion;
   forming a polysilicon layer above the first sacrificial oxide portion and the second sacrificial oxide portion; and
   etching the first sacrificial oxide portion to form a first portion of a continuous wide trench and etching the second sacrificial oxide portion to form a second portion of the continuous wide trench, wherein the continuous wide trench extends through a space formerly occupied by the first sacrificial silicon slab.

2. The method of claim 1, wherein forming a first sacrificial oxide portion comprises:
   oxidizing at least a portion of the first sacrificial slab.

3. The method of claim 2, further comprising:
   forming an oxide layer on an upper surface of the first sacrificial oxide portion.

4. The method of claim 1, further comprising:
   etching the first sacrificial slab to expose opposing sides of the first sacrificial oxide portion and the second sacrificial oxide portion;
   forming a third sacrificial oxide portion between the exposed opposing sides of the first sacrificial oxide portion and the second sacrificial oxide portion; and
   etching the third sacrificial oxide portion.

5. The method of claim 4, further comprising:
   forming a mask above the first sacrificial slab; and
   exposing the first sacrificial slab with an etchant.

6. The method of claim 1, wherein defining a first side of a sacrificial silicon slab comprises;
   etching the first trench using deep reactive ion etching.

7. The method of claim 6, wherein defining a second side of the first sacrificial silicon slab comprises:
   defining a first side of a second sacrificial silicon slab.

8. A method of forming a continuous wide trench in a silicon on insulator (SOI) wafer comprising:
   etching a first trench in a device layer;
   etching a second trench in the device layer, thereby defining a first sacrificial slab between the first trench and the second trench;
   filling the first trench with a first sacrificial oxide portion;
   filling the second trench with a second sacrificial oxide portion;
   sacrificing the first sacrificial slab;
   etching the first sacrificial oxide portion to form a first portion of a continuous wide trench; and
   etching the second sacrificial oxide portion to form a second portion of the continuous wide trench, wherein the continuous wide trench extends through a space formerly occupied by the first sacrificial slab.

9. The method of claim 8, further comprising, before etching the first sacrificial oxide portion:
   forming a polysilicon layer above the first sacrificial oxide portion.

10. The method of claim 8, wherein sacrificing the first sacrificial slab comprises:
   oxidizing the first sacrificial slab to form the first sacrificial oxide portion.

11. The method of claim 10, further comprising:
   forming an oxide layer on an upper surface of the first sacrificial oxide portion.

12. The method of claim 8, further comprising:
   etching the first sacrificial slab to create a first gap;
   forming a third sacrificial oxide in the first gap; and
   etching the third sacrificial oxide.

13. The method of claim 12, further comprising:
   forming a mask above the first sacrificial slab; and
   exposing the masked first sacrificial slab with an etchant.

14. The method of claim 8, wherein etching the first trench comprises;
   etching the first trench using deep reactive ion etching.

15. The method of claim 8, further comprising:
   etching a third trench to the insulator layer, thereby defining a second sacrificial slab;
   sacrificing the second sacrificial slab to form a second gap:
   forming a third sacrificial oxide portion in the second gap; and
   etching the third sacrificial oxide portion.

* * * * *